United States Patent [19]
Shiraishi et al.

[11] Patent Number: 5,966,201
[45] Date of Patent: Oct. 12, 1999

[54] MARK FOR POSITION DETECTION, AND MARK DETECTING METHOD AND APPARATUS

[75] Inventors: Naomasa Shiraishi, Saitama-ken; Nobutaka Magome, Kanagawa-ken, both of Japan

[73] Assignee: Nikon Corporation, Tokyo, Japan

[21] Appl. No.: 08/966,371

[22] Filed: Nov. 7, 1997

[30] Foreign Application Priority Data

Nov. 7, 1996 [JP] Japan ................................... 8-311410

[51] Int. Cl.⁶ ........................... G03B 27/42; G03F 9/00
[52] U.S. Cl. ................................ 355/53; 430/5
[58] Field of Search .................... 356/400, 401, 356/399; 355/53, 77; 250/548; 430/5, 30

[56] References Cited

U.S. PATENT DOCUMENTS

| | | | |
|---|---|---|---|
| 4,423,127 | 12/1983 | Fujimura | 430/22 |
| 5,521,036 | 5/1996 | Iwamoto et al. | 430/22 |
| 5,615,006 | 3/1997 | Hirukawa et al. | 356/124 |
| 5,640,243 | 6/1997 | Koitabashi et al. | 356/401 |
| 5,682,243 | 10/1997 | Nishi | 356/401 |
| 5,721,607 | 2/1998 | Ota | 355/53 |
| 5,751,428 | 5/1998 | Kataoka et al. | 356/401 |
| 5,783,833 | 7/1998 | Sugaya et al. | 250/548 |

*Primary Examiner*—Safet Metjahic
*Assistant Examiner*—Hung Henry Nguyen
*Attorney, Agent, or Firm*—Armstrong, Westerman, Hattori, McLeland & Naughton

[57] ABSTRACT

A mark for position detection formed on a substrate has a first pattern disposed near the center of the mark and having periodicity in a Y-axis direction, and second patterns respectively disposed near both sides of the first pattern in an X-axis direction and each having periodicity in the X-axis direction. The position of the first pattern is detected by aligning the detection center of a detecting optical system, that is, the minimal aberration point of the detecting optical system, with the center of the first pattern. The positions of the second patterns are detected at respective points symmetric with respect to the minimal aberration point, and the detected values for the positions of the second patterns are averaged. An apparatus for detecting the mark for position detection detects the first and second patterns by image processing when the mark is in a stationary state.

34 Claims, 7 Drawing Sheets

MARK FOR POSITION DETECTION, AND MARK DETECTING METHOD AND APPARATUS

BACKGROUND OF THE INVENTION

The present invention relates to a mark for position detection and a mark detecting method and apparatus, and also relates to an exposure system. More particularly, the present invention relates to a mark for position detection formed on a plane surface of a substrate and a method and apparatus for detecting the mark, and also relates to an exposure system having the mark detecting apparatus as a device for detecting the position of the substrate. The mark for position detection according to the present invention is suitable for use in an exposure system to align a mask pattern and a photosensitive substrate in a photolithography process in which the substrate is exposed in accordance with the mask pattern to produce, for example, a semiconductor device.

In photolithography processes for producing micro devices, e.g. semiconductor devices, liquid-crystal display devices, image pickup devices (CCDs), or thin-film magnetic heads, a projection exposure system is used in which an image of a photomask or a reticle (hereinafter generally referred to as "reticle"), which has a transfer pattern formed thereon, is projected onto a substrate coated with a photosensitive material (photoresist), e.g. a wafer or a glass plate (hereinafter referred to as "wafer"), through a projection optical system.

In this type of projection exposure system, alignment of the reticle and the wafer must be carried out with high accuracy before exposure. To perform the alignment, the wafer has marks for position detection (alignment marks) formed (transferred by exposure) in a preceding photolithography process. By detecting the position of such an alignment mark, the position of the wafer (or a circuit pattern on the wafer) can be accurately detected.

The alignment marks on the wafer are entirely unnecessary for the operating characteristics of the completed micro device. Therefore, it is desirable that the size of the marks be as small as possible. Alignment marks are generally set in the boundary regions between micro devices, which are known as "street lines", i.e. "margins" for cutting the micro devices from each other after the completion of various processes. The street lines are belt-shaped regions each having a width of the order of from 70 to 90 micrometers. Therefore, the length of each shorter side of alignment marks is desirably not greater than 70 micrometers.

Some methods of detecting the position of a mark on a wafer have already been put to practical use. The mainstream of recent mark position detecting methods is an image detection method in which an optical mark image is detected, and the mark position is detected on the basis of the image intensity distribution.

Because the above-described alignment requires an extremely high degree of accuracy, the mainstream of conventional mark position detecting methods is such that marks (X mark and Y mark) are used exclusively for two orthogonal directions (X direction and Y direction), and the positions of these marks are successively measured. In general, line-and-space patterns having periodicity in the measuring directions have heretofore been used as the X and Y marks (marks for one-dimensional measurement).

FIGS. 8A and 8B show examples of the conventional marks for one-dimensional measurement. FIG. 8A shows a mark MX used for detection in the X direction. FIG. 8B shows a mark MY for detection in the Y direction. These marks MX and MY are used in a pair (there has been no specific restriction on the positional relationship between the two marks). In the conventional practice, position detection is first carried out with respect to one direction (X direction or Y direction) using one mark, and then position detection is carried out with respect to the other direction (Y direction or X direction) using the other mark.

As has been stated above, the length of each shorter side of these marks is demanded to be not greater than the street line width (in general, from 70 micrometers to 90 micrometers). Therefore, the widths of these marks in the non-detecting direction (Y direction for MX; X direction for MY) have generally been restricted to a length not greater than about 70 micrometers from the above restriction.

A mark detecting optical system for detecting the position of a mark as described above needs to be corrected for aberrations to an extremely high degree. The aberration correction includes not only the correction of aberrations due to errors in designing the optical system but also the correction of aberrations due to errors in machining, i.e. decentration of the lens and an error in the surface accuracy. In particular, errors in machining are difficult to eliminate completely. Therefore, after the assembly of the optical system, adjustment is made to minimize the residual aberrations at a specific "mark detecting position" (one point in the detecting area near the optical axis of the detecting optical system), thereby reducing the influence of the residual aberrations during the detection. Accordingly, if the position for detecting a mark deviates from the above-described minimal aberration point, a detection error due to the residual aberrations arises, and the mark detection accuracy degrades.

In the above-described conventional technique, the mark detection for position detection is carried out with respect to the X and Y directions separately from each other. Therefore, it takes a long time to detect the marks, and this causes the processing capacity (throughput) of the projection exposure system to be reduced unfavorably.

In view of the above-described circumstances, a conventional technique uses two-dimensional marks that enable simultaneous detection with respect to both the X and Y two-dimensional directions.

FIG. 9 shows one example of two-dimensional marks for detection in both the X and Y directions. A mark MG shown in FIG. 9 per se has periodicity in two-dimensional directions. However, as will be clear from FIG. 9, the size of the mark edge (boundary between black and white), which is effective for the position detection in each of the X and Y directions, relative to the mark area undesirably reduces to approximately a half of that of one-dimensional marks (MX and MY) because of the periodicity in the two-dimensional directions. Therefore, the mark area must be increased in order to obtain a detection accuracy equal to that in the case of the one-dimensional marks (MX and MY). However, if the mark area is increased, the length of one side (or shorter side) of the mark becomes greater than the street line width (e.g. 100 micrometers or more in the case of FIG. 9), and hence a part of the mark undesirably extends over the circuit pattern on the wafer. Accordingly, the restriction on the mark formation position increases unfavorably.

If a two-dimensional mark Mt as shown in FIG. 10 is used in which an X-direction one-dimensional detection mark portion Ma and a Y-direction one-dimensional detection mark portion Mb are disposed in a side-by-side relation to each other, the length of each shorter side of the mark can be made not greater than the street line width.

However, the mark Mt shown in FIG. 10 suffers from problems in terms of the detection accuracy. That is, the mark detecting optical system has been adjusted such that the residual aberrations are minimized at a specific "mark detecting position" (one point in the detecting area near the optical axis of the detecting optical system), as stated above. Therefore, if a detection mark portion for one direction, e.g. the Y-direction detection mark portion Mb (or the X-direction detection mark portion Ma), is disposed near the optical axis, the other mark portion Ma (or the mark portion Mb) for the other direction lies apart from the optical axis. Consequently, the detected value for the position of the latter mark portion Ma (or Mb) is adversely affected by the residual aberrations of the optical system when the position of the mark Mt is detected with respect to both the X and Y directions simultaneously. Consequently, detection errors increase unfavorably. (This problem will be described later in more detail to compare the present invention with the conventional technique in the description of the embodiments).

BRIEF SUMMARY OF THE INVENTION

In view of the above-described circumstances, one object of the present invention is to provide a mark for position detection that enables the time required for mark detection to be shortened and makes it possible to effect position detection of high accuracy substantially independently of the residual aberrations of a detecting optical system.

Another object of the present invention is to provide an alignment mark capable of meeting a demand for the mark size.

Another object of the present invention is to provide a mark detecting method that enables the time required for mark detection to be shortened and that permits mark position detection to be effected with high accuracy substantially independently of the residual aberrations of a detecting optical system.

Another object of the present invention is to provide a mark detecting apparatus that enables the time required for mark detection to be shortened and that permits mark position detection to be effected with high accuracy substantially independently of the residual aberrations of a detecting optical system.

Another object of the present invention is to provide an exposure system capable of achieving an improvement in the throughput and of realizing registration of high accuracy.

The present invention provides a mark for position detection arranged as follows: The mark is formed on a substrate to detect the position of the substrate in a predetermined first axis direction (e.g. a Y-axis direction) and in a second axis direction (e.g. an X-axis direction) perpendicular to the first axis direction. The mark has a first pattern disposed near the center of the mark and having periodicity in the first axis direction, and second patterns respectively disposed near both sides of the first pattern in the second axis direction and each having periodicity in the second axis direction.

With the above-described arrangement, the first pattern is detected by a detecting optical system in a state where the detection center of the optical system is coincident with a predetermined reference point in a mark region in which the first pattern is formed (e.g. the center of the first pattern). That is, the first pattern is detected at the minimal aberration point of the detecting optical system. At the same time, the second patterns are detected at respective points symmetric with respect to the minimal aberration point, and the detected values for the positions of the second patterns are averaged. Thus, the position in the first and second axis directions of the mark for position detection can be detected with high accuracy substantially independently of the residual aberrations of the detecting optical system. Accordingly, the time required for mark detection can be shortened, and moreover, position detection of high accuracy can be effected substantially independently of the residual aberrations of the detecting optical system.

In this case, the period of each of the first and second patterns is desirably in the range of from about 6 micrometers to about 16 micrometers. The reason for this is as follows: The mark for position detection is generally formed on the substrate as a step-shaped mark by a photolithography process. Therefore, if the pattern period is smaller than 6 micrometers, the mark may be undesirably buried by the mark forming process. If the pattern period is larger than 16 micrometers, the number of pattern elements of the mark that can be captured on the image pickup area of an image pickup device (CCD), which is generally used for the mark detection, becomes excessively small, and the detection accuracy is degraded. Accordingly, if the pattern period is set in the range of from about 6 micrometers to about 16 micrometers, there are no such problems, and mark position detection of higher accuracy can be realized.

In these cases, the length of each short side of a mark region in which the first and second patterns are formed is desirably in the range of from about 50 micrometers to about 70 micrometers. The reason for this is as follows: As stated above, the mark for position detection is generally set in a belt-shaped boundary region (street line) between micro devices, which has a width of the order of 70 to 90 micrometers. Considering that a dicing saw used to cut the wafer along the street line has a width of the order of 70 micrometers at maximum, the length of each short side of the mark region is desirably set at a value not greater than 70 micrometers. By doing so, the mark for position detection can readily be formed within the street line. Therefore, the mark is not substantially restricted by the mark formation position. If the length of each short side of the mark region is smaller than 50 micrometers, the area of the mark becomes excessively small, causing the position detection accuracy to be degraded. Therefore, the length of each short side of the mark region is preferably not less than 50 micrometers. Thus, in a case where the length of each short side of the mark region is set in the range of from about 50 micrometers to 70 micrometers, it is possible to meet a demand for the mark size satisfactorily.

In addition, the present invention provides a mark detecting method for detecting the position of the above-described mark for position detection in a predetermined first axis direction (e.g. a Y-axis direction) and in a second axis direction (e.g. an X-axis direction) perpendicular to the first axis direction. The method is characterized in that the position in the first axis direction of the mark is detected from a mark region near a predetermined detection center, and the position in the second axis direction of the mark is detected from each of two mark regions a predetermined distance away from both sides of the detection center in the second axis direction.

In addition, the present invention provides a mark detecting apparatus for detecting the position of the above-described mark for position detection formed on a substrate in a predetermined first axis direction (e.g. a Y-axis direction) and in a second axis direction (e.g. an X-axis direction) perpendicular to the first axis direction. The apparatus has a substrate stage on which the substrate formed with the above-described mark for position detection is placed, and which is movable in a reference plane, together with the substrate placed thereon; an image processing type mark detecting system that photoelectrically detects the mark; and an image processor that obtains the position of the mark in the first and second axis directions by processing a detection signal detected by the mark detecting system.

By virtue of the above arrangement, the substrate formed with the above-described mark for position detection is placed on the substrate stage; therefore, the mark can be photoelectrically detected by the mark detecting system in a state where the substrate stage is stationary. When the mark is photoelectrically detected by the mark detecting system, the image processor processes the detection signal detected by the mark detecting system, thereby obtaining the position in the first and second axis directions of the mark. Thus, it is possible to obtain the position of the mark in the two-dimensional directions in a state where the substrate stage is stationary, that is, by a single detecting operation. To detect the mark by the mark detecting system, the detection center of the detecting optical system, which constitutes the mark detecting system, is made coincident with the center of the first pattern, which constitutes the mark for position detection. Thus, the first pattern is detected at the minimal aberration point of the detecting optical system. Moreover, the second patterns are detected at two points symmetric with respect to the minimal aberration point, and the detected values for the positions of the second patterns are averaged. Thus, the position of the mark in the first and second axis directions can be detected with high accuracy substantially independently of the residual aberrations of the detecting optical system.

In addition, the present invention provides an exposure system in which an image of a pattern formed on a mask is projected by exposure onto a substrate coated with a photosensitive material through a projection optical system. The system has the above-described mark detecting apparatus as a device for detecting the position of the substrate.

The exposure system makes it possible to shorten the time required to detect the position detection mark on the substrate in comparison to the conventional practice that uses one-dimensional marks. Moreover, it is possible to detect the position of the mark in the first and second axis directions with high accuracy substantially independently of the residual aberrations of the detecting optical system, which constitutes the mark detecting system. Consequently, it becomes possible to achieve an improvement in the throughput and an improvement in the alignment accuracy and hence possible to improve the overlay accuracy.

BRIEF DESCRIPTION OF THE SEVERAL VIEWS OF THE DRAWING

FIGS. 8A and 8B are schematic illustrations showing examples of conventional marks for one-dimensional measurement, in which FIG. 8A shows a mark used for detection in an X direction, and FIG. 8B shows a mark used for detection in a Y direction.

DETAILED DESCRIPTION OF THE INVENTION

One embodiment of the present invention will be described below with reference to FIGS. 1 to 7.

Figure 1:
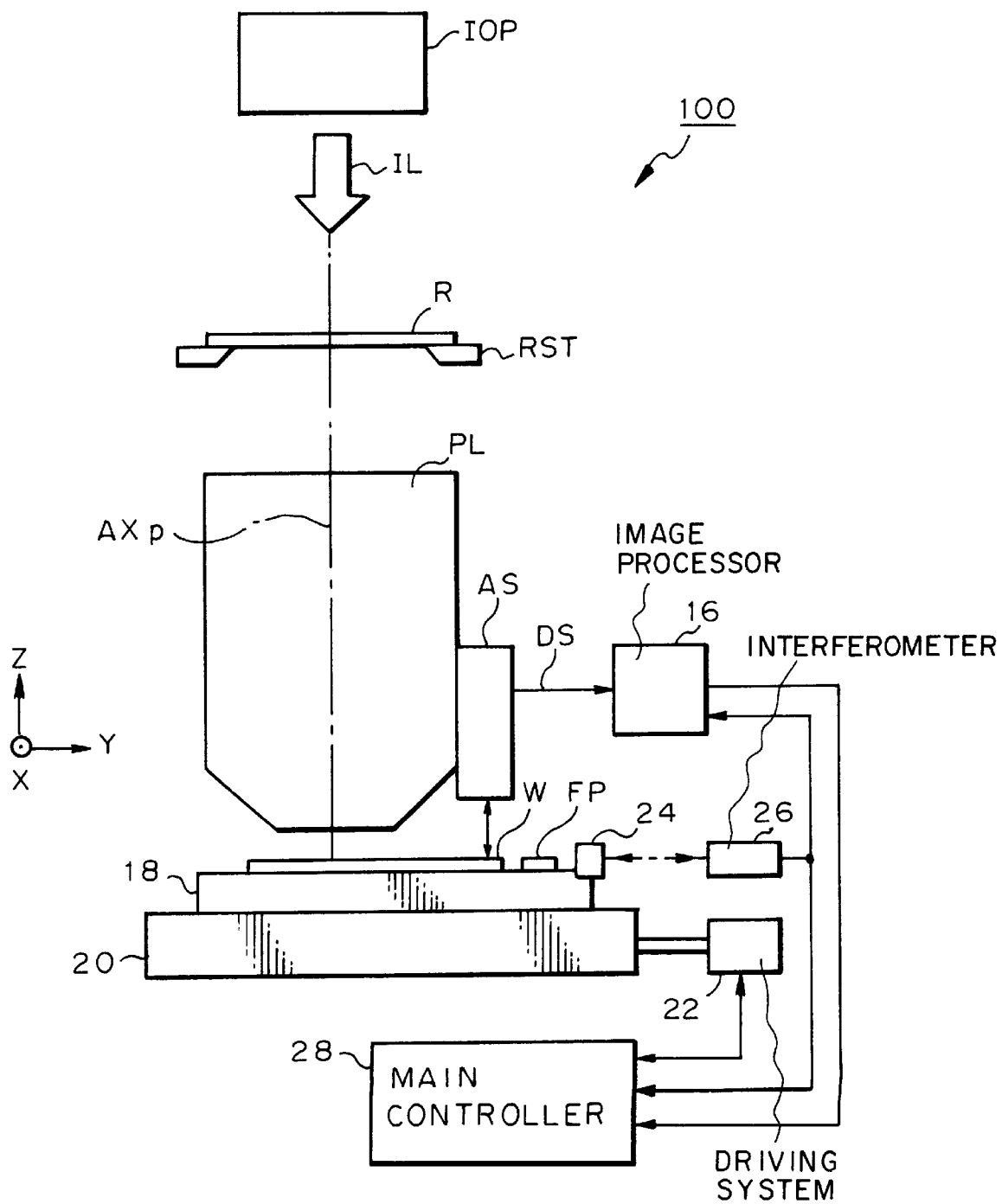
FIG. 1 is a schematic illustration showing the arrangement of a projection exposure system according to one embodiment of the present invention.

FIG. 1 shows a projection exposure system 100 according to one embodiment of the present invention which has a position detecting apparatus according to the present invention as an off-axis alignment sensor. The projection exposure system 100 is a step-and-repeat type reduction projection exposure system (so-called stepper).

The projection exposure system 100 has an illumination system IOP; a reticle stage RST for holding a reticle R as a mask; a projection optical system PL that projects an image of a pattern formed on the reticle R onto a wafer W as a substrate coated with a photosensitive material (photoresist); an XY stage 20 as a substrate stage holding the wafer W and moving in a two-dimensional plane (XY-plane), together with the wafer W; a driving system 22 driving the XY stage 20; and a main controller 28 that comprises a minicomputer (or microcomputer) including a CPU, ROM, a RAM, an I/O interface, etc. and that overall controls the whole system.

The illumination system IOP comprises a light source a mercury vapor lamp, an excimer laser or the like) and an illumination optical system including a fly's-eye lens, a relay lens, a condenser lens, etc. The illumination system IOP illuminates the pattern on the lower surface (pattern forming surface) of the reticle R with a uniform illuminance distribution of illuminating light IL for exposure from the light source. As the illuminating light IL for exposure, an emission line, e.g. the i-line from a mercury vapor lamp, or KrF, ArF or other excimer laser light may be used.

The reticle R is secured to the surface of the reticle stage RST through a securing device (not shown). The reticle stage RST can be finely driven by a driving system (not shown) in an X-axis direction (a direction perpendicular to the plane of FIG. 1), a Y-axis direction (a lateral direction in the plane of FIG. 1) and a O-direction (a direction of rotation in the XY-plane). Thus, the reticle stage RST can position (align) the reticle R such that the center of the pattern of the reticle R (reticle center) is approximately coincident with an optical axis AXp of the projection optical system PL. FIG. 1 shows the projection exposure system 100 in a state where the reticle alignment has been performed.

The projection optical system PL is set such that the optical axis AXp is perpendicular to the plane of travel of the reticle stage RST. The optical axis AXp is defined as a Z-axis direction. In this embodiment, the projection optical system PL is telecentric on both sides and has a predetermined reduction magnification β(β is 1/5, for example). Accordingly, if the reticle R is illuminated with a uniform illuminance by the illuminating light IL in a state where the pattern of the reticle R and a shot area on the wafer W have been aligned, the pattern on the pattern forming surface is projected onto the photoresist-coated surface of the wafer W as an image demagnified at the reduction magnification β by the projection optical system PL. In this way, the demagnified image of the pattern is formed in each shot area on the wafer W.

In actual practice, the XY stage 20 comprises a Y stage that moves in the Y-axis direction over a base (not shown) and an X stage that moves in the X-axis direction over the Y stage. However, in FIG. 1, the XY stage 20 is shown as a representative of the two stages. A wafer table 18 is mounted on the XY stage 20, and the wafer W is held on the wafer table 18 by suction or the like through a wafer holder (not shown).

The wafer table 18 causes the wafer holder holding the wafer W to move finely in the Z-axis direction. Thus, the wafer table 18 is also known as "Z stage". A moving mirror 24 is provided on the upper surface of one end portion of the wafer table 18. A laser interferometer 26 is provided to face opposite to a reflecting surface of the moving mirror 24. The laser interferometer 26 projects a laser beam onto the moving mirror 24 and receives the reflected laser beam to thereby measure the position in the XY-plane of the wafer table 18. It should be noted that in actual practice there are provided an X moving mirror having a reflecting surface perpendicularly intersecting the X-axis and a Y moving mirror having a reflecting surface perpendicularly intersecting the Y-axis, and there are provided an X laser interferometer for position measurement in the X direction and a Y laser interferometer for position measurement in the Y direction in association with the X and Y moving mirrors. However, in FIG. 1, the moving mirror 24 is shown as a representative of the X and Y moving mirrors, and the laser interferometer 26 as a representative of the X and Y laser interferometers. Accordingly, it is assumed that in the foregoing description the XY coordinate position of the wafer table 18 is measured by the laser interferometer 26.

Measured values obtained from the laser interferometer 26 are supplied to the main controller 28. The main controller 28 monitors the measured values from the laser interferometer 26, and while doing so, drives the XY stage 20 through the driving system 22, thereby positioning the wafer table 18. In addition, an output of a focus sensor (not shown) is also supplied to the main controller 28. The main controller 28 drives the wafer table 18 in the Z-axis direction (focusing direction) through the driving system 22 on the basis of the output of the focus sensor. In other words, the wafer W is positioned in the three axis directions, i.e. X, Y and Z, through the wafer table 18.

In addition, a fiducial plate FP is fixed on the wafer table 18 such that the surface of the fiducial plate FP is flush with the surface of the wafer W. The surface of the fiducial plate FP is formed with various fiducial marks including those which are used for base line measurement and so forth.

In this embodiment, further, an off-axis alignment sensor AS is provided on a side surface of the projection optical system PL as a mark detecting system that detects a mark for position detection formed on the wafer W. As the alignment sensor AS, an image processing type imaging alignment sensor is used.

Figure 2:
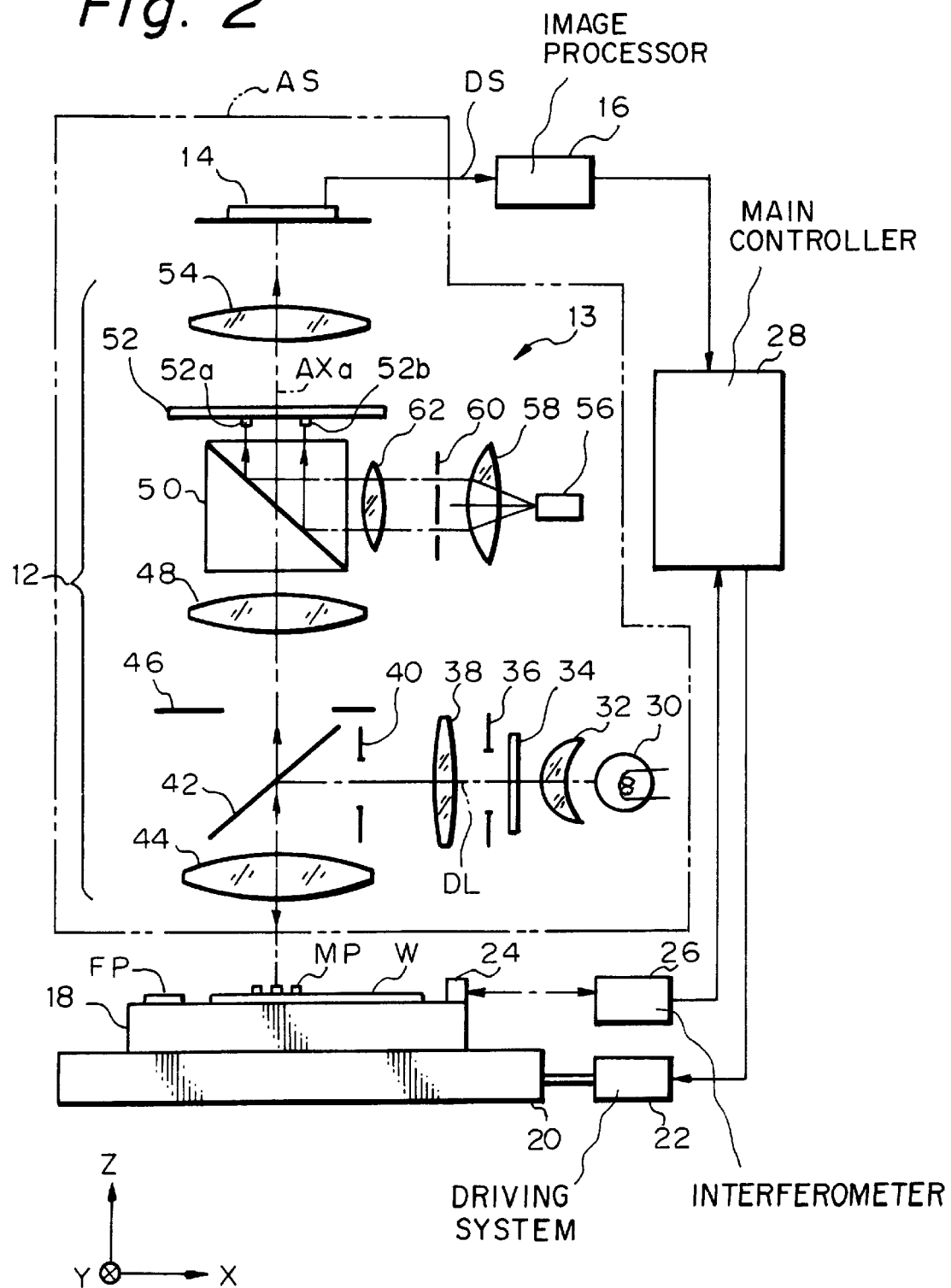
FIG. 2 is a detail view showing the arrangement of an alignment sensor in FIG. 1.

FIG. 2 shows the arrangement of the alignment sensor AS in detail. As shown in FIG. 2, the alignment sensor AS includes a detecting optical system 12 that applies illuminating light to a mark MP for position detection (described later in detail) formed on the surface of the wafer W and also applies illuminating light to index marks formed on an index board 52 (described later) used as reference marks to determine the detection center of the alignment sensor AS. The alignment sensor AS further includes a CCD 14 as a two-dimensional image pickup device that picks up two-dimensional images of the mark MP and index marks.

The detecting optical system 12 includes a light source 30, a condenser lens 32, a wavelength selecting element 34, an illuminating field stop 36, a relay lens 38, an illuminating aperture stop 40, a beam splitter 42, an objective lens 44, an imaging aperture stop 46, an imaging lens 48, a beam splitter (compound prism) 50, an index board 52, a relay lens 54, a light source 56, a condenser lens 58, an index illuminating field stop 60, a lens 62, etc. Each constituent part of the detecting optical system 12, together with the operation thereof, will be described below.

The light source 30 is formed by using a halogen lamp or the like that emits broadband illuminating light. The reason for this is as follows: In the case of an image processing type alignment sensor, if monochromatic light is used as a light source, it may be impossible to surely detect a mark image owing to the effect of thin-film interference or the like due to the photoresist coated on the surface of the wafer W. For this reason, a light source that emits incoherent light is used. Accordingly, in a case where there is substantially no effect of thin-film interference or the like caused by the resist, a laser light source that emits laser light may be used as a light source.

Broadband illuminating light emitted from the light source 30 is made incident on the illuminating field stop 36 through the condenser lens 32 and the wavelength selecting element (e.g. a sharp cut filter or an interference filter) 34.

The wavelength selecting element 34 transmits only a beam of light in a wavelength range (e.g. from 550 nanometers to 750 nanometers) to which the photoresist coated on the wafer W is not photosensitive (the photoresist being photosensitive to light of 365 nanometers or 248nanometers, for example). However, in a case where the alignment sensor AS according to this embodiment is used to detect the position of a substrate not coated with a photoresist, it is unnecessary to prevent such exposure. Therefore, it is also possible to use a light beam of a short wavelength close to the wavelength of exposure light. For example, the alignment sensor AS may be used as a device for detecting an overlay error in registration of a circuit pattern formed on a wafer and a resist pattern formed by transferring a mask pattern image over the circuit pattern by exposure light and developing the transferred mask pattern image.

Illuminating light DL passing through a transmitting part of the illuminating field stop 36 enters the illuminating aperture stop 40 through the relay lens 38. Then, the illuminating light DL is reflected vertically downward by the beam splitter 42 to pass the objective lens 44 disposed on the wafer side of the beam splitter 42. Thereafter, the illuminating light DL illuminates an illumination area containing the mark MP for position detection formed on the wafer W.

Figure 3:
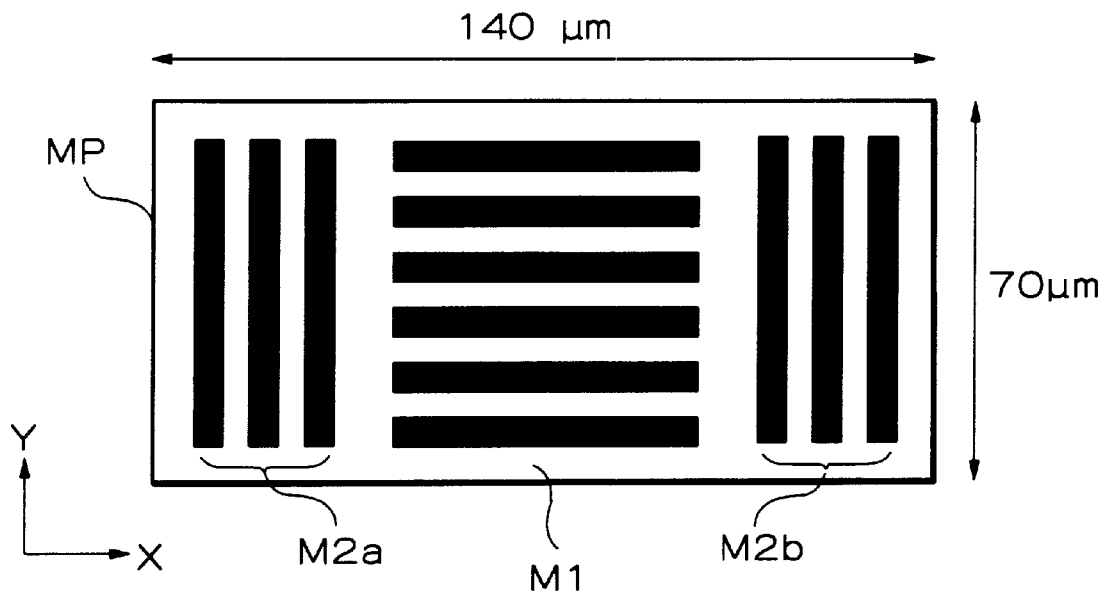
FIG. 3 is a schematic illustration showing one example of a mark for position detection according to the present invention.

The mark MP for position detection is a planar mark as shown in FIG. 3 (described later). However, in many cases, such a mark for position detection is formed on the wafer W as not a planar mark but a step-shaped mark in which a mark portion and the other portion define a step.

The illuminating field stop 36 is practically in a conjugate relation (image-formation relation) to the surface (mark MP for position detection) of the wafer W. Therefore, the illumination area on the wafer W can be limited according to the shape and size of the transmitting part of the illuminating field stop 36.

A light beam reflected from the illumination area on the wafer W, which contains the mark MP for position detection, passes successively through the objective lens 44 and the beam splitter 42 to reach the imaging aperture stop 46. After passing through the imaging aperture stop 46, the light beam is converged by the imaging lens 48 and passes through the beam splitter 50 to form an image of the mark MP for position detection on the index board 52.

The index board 52 has a total of four index marks provided at predetermined positions, respectively. The index marks include index marks 52a and 52b serving as reference marks for mark position detection in the X direction and index marks 52c and 52d serving as reference marks for mark position detection in the Y direction. The four index marks 52a, 52b, 52c and 52d are positioned so as to surround an optical axis AXa of the detecting optical system 12 (however, in FIG. 2 only the X-direction index marks 52a and 52b are shown; for all the four index marks 52a, 52b, 52c and 52d, see FIG. 4). Thus, the alignment sensor AS is adapted to detect the position of the mark MP in both the X and Y directions simultaneously.

The index marks 52a, 52b, 52c and 52d are illuminated by an index board illuminating system 13 described below. The index board illuminating system 13 includes a light source 56, e.g. a light-emitting diode (LED), a condenser lens 58, an index illuminating field stop 60, a lens 62, etc. The shape of a transmitting part of the index illuminating field stop 60 is so selected that, after being reflected by the beam splitter 50, illuminating light from the index board illuminating system 13 illuminates only a small area containing the index marks 52a, 52b, 52c and 52d.

In contrast, the shape of the transmitting part of the illuminating field stop 36 is so selected that illuminating light does not illuminate the small area containing the index marks 52a, 52b, 52c and 52d (i.e. so as to shield the small area from the illuminating light). Therefore, a two-dimensional image of the mark MP for position detection and a two-dimensional image of the index marks 52a, 52b, 52c and 52d can be formed separately from each other. Consequently, the two-dimensional images of the two different kinds of mark are not duplicated by different illumination systems. Thus, it becomes possible to detect the positions of the marks surely and highly accurately.

Light from the image of the position detection mark MP formed on the index board 52 and light from the index marks 52a, 52b, 52c and 52d on the index board 52 are focused onto the CCD 14 through the relay lens 54 to form respective two-dimensional images on the image pickup surface of the CCD 14.

An image signal DS from the alignment sensor AS (more specifically, from the CCD 14), which is formed as described above, is supplied to an image processor 16 in the subsequent stage. The image processor 16 detects the position of the mark MP for position detection on the wafer W (i.e. the relative position of the mark MP with respect to the index center) on the basis of the image signal from the CCD 14, that is, on the basis of the distance between the image of the position detection mark MP and the image of the index marks 52a and 52b (or the distance between the image of the position detection mark MP and the image of the index marks 52c and 52d). Then, the image processor 16 transmits the detected position of the position detection mark MP to a main controller 28.

Next, one example of marks for position detection according to the present invention formed on the wafer W will be described with reference to FIG. 3. A mark MP shown in FIG. 3 comprises a first mark portion M1 as a first pattern which is disposed in the center in the X-axis direction (second axis direction) of a mark forming region and which has periodicity in the Y-axis direction (first axis direction), and a pair of second mark portions M2a and M2b as second patterns which are respectively disposed on both sides of the first mark portion M1 in the X-axis direction perpendicular to the Y-axis direction and which have periodicity in the X-axis direction. The first mark portion M1 is used for position measurement in the Y-axis direction, and the second mark portions M2a and M2b are used for position detection in the X-axis direction. The pitch of mark elements constituting each of the mark portions M1, M2a and M2b is, for example, of the order of 12 micrometers (6 micrometer line and space).

It should be noted that the pitch of the mark elements of the mark portions M1, M2a and M2b is not necessarily limited to 12 micrometers, but a finer pitch may be used. However, an excessively fine pitch may cause the mark elements to be undesirably indistinguishable by planarization carried out in the micro device manufacturing process, resulting in the mark portions M1, M2a and M2b being lost. For this reason, it is desirable that the pitch of the mark elements of the mark portions M1, M2a and M2b be not smaller than 6 micrometers.

The pitch of the mark elements of the mark portions M1, M2a and M2b may be set at a larger value. However, as the pitch becomes larger, the number of mark elements of the mark portions M1, M2a and M2b that can be disposed in the street line area decreases, and it becomes difficult to obtain the averaging effect. Therefore, it is desirable that the pitch of the mark elements of the mark portions M1, M2a and M2b be not larger than about 16 micrometers.

As has been stated above, the length of each short side of marks for position detection is demanded to be not larger than the street line width (in general, from 70 to 90 micrometers). As shown in FIG. 3, the mark MP for position detection according to the present invention can reduce the mark width in either of the X- and Y-axis directions (in FIG. 3, the mark width in the Y-axis direction) to a value not larger than about 70 micrometers. The length in the other direction becomes slightly larger than that of the conventional one-dimensional marks. However, this causes no problem because there is no restriction in the lengthwise direction with regard to the street line.

A method of detecting the mark MP for position detection by the projection exposure system 100 according to this embodiment will be described below with reference to FIG. 4.

Figure 4:
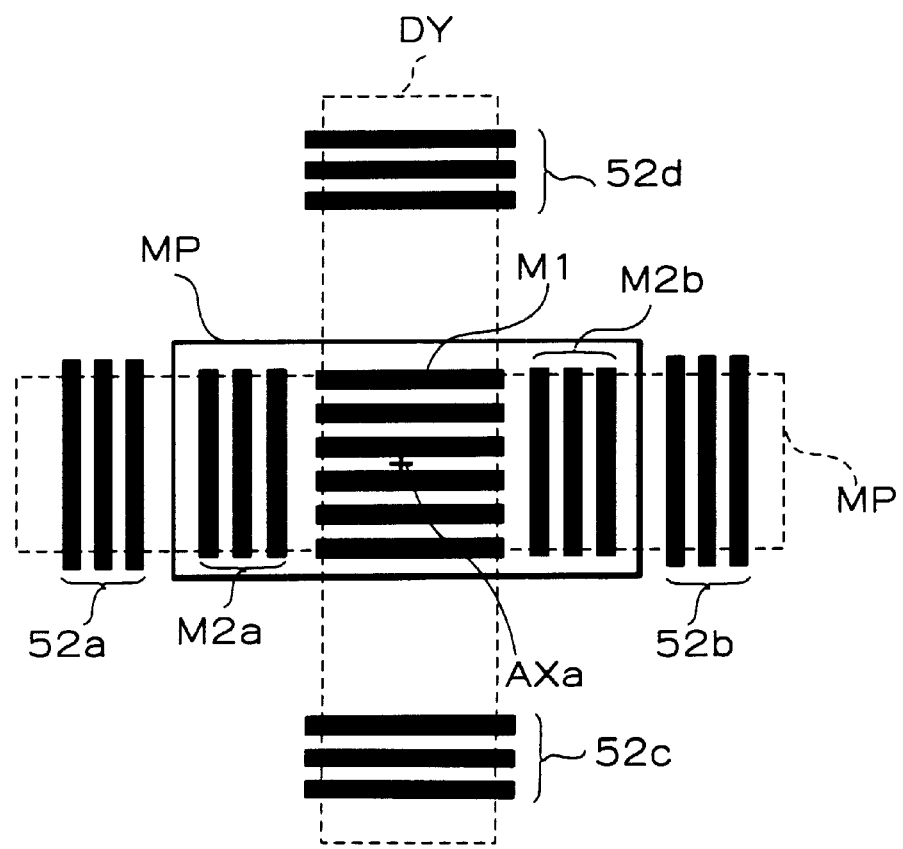
FIG. 4 is a schematic illustration for explaining a method of detecting the mark for position detection in FIG. 3 by the projection exposure system according to one embodiment of the present invention.

In this embodiment, the index board 52 is provided with a total of four index marks as shown in FIG. 4, i.e. index marks 52a and 52b for the X direction and index marks 52c and 52d for the Y direction, which are disposed at respective positions such that the index marks 52a and 52b face each other across the optical axis AXa of the detecting optical system 12, and the index marks 52c and 52d face each other across the optical axis AXa.

To perform position detection, the wafer W is set by rough alignment such that the center of the mark MP for position detection is approximately coincident with the optical axis AXa of the detecting optical system 12. The rough alignment enables the wafer W to be aligned with an accuracy of the order of ±1 micrometer at worst according to the accuracy of a typical search alignment mechanism in the present state of art, although the rough alignment accuracy depends on the accuracy of a search alignment mechanism (not shown).

As a result of the rough alignment, an image of the position detection mark MP and an image of the index marks 52a, 52b, 52c and 52d, which are provided on the index board 52, are formed on the image pickup device 14 with a positional relationship as shown in FIG. 4. The image processor 16 executes image processing on images of specific regions of these images, i.e. an image of an X-direction detecting area DX surrounded by a broken line rectangle and an image of a Y-direction detecting area DY similarly surrounded by a broken line rectangle. The image processor 16 detects a positional relationship between the index marks 52a and 52b and the mark portions M2a and M2b from the image of the detecting area DX and a positional relationship (relative position) between the index marks 52c and 52d and the mark portion M1 from the image of the detecting area DY. The relative position between the index marks 52a and 52b and the mark portions M2a and M2b is a detected value in the X direction of the mark MP for position detection, and the positional relationship (relative position) between the index marks 52c and 52d and the mark portion M1 is a detected value in the Y direction of the mark MP.

To detect the position of each of the index marks 52a, 52b, 52c and 52d and mark portions M1, M2a and M2b, a conventional detection algorithm, e.g. the slice method or the correlative method, should be used. The image of the X-direction detecting area DX contains the image of the Y-direction mark portion M1, which is unrelated to the detection in the X direction. In this regard, the detection algorithm in the image processor 16 should be set such that during the position detection in the X direction, only the images of the index marks 52a and 52b and second mark portions M2a and M2b are processed. More specifically, in the image of the X-direction detecting area DX, the contrast change in the first mark portion M1 is smaller than the contrast change in the X-direction mark portions M2a and M2b (i.e. the contrast change is about a half of the latter). Accordingly, the level of the signal intensity in the mark portion M1 is lower than that of the signal intensity in the mark portions M2a and M2b. Therefore, it is conceivable to set the slice level higher than the level of the signal intensity in the mark portion M1, by way of example.

The distance between the index marks 52a and 52b on the index board 52 is set sufficiently long to put the mark MP therebetween. The distance between the index marks 52c and 52d may be set to put only the mark portion M1 therebetween. In actual practice, however, the mark MP may be necessary to be formed not in a street line extending in the X direction but in a street line extending in the Y direction, depending upon the design of semiconductor devices to be formed on the wafer W. In such a case, a mark obtained by rotating the mark MP in FIG. 3 through 90 degrees is used. Therefore, it is desirable that the distance between the index marks 52c and 52d be also sufficiently long to put the 90 degree-rotated mark MP therebetween.

The detecting optical system 12 constituting the alignment sensor AS according to this embodiment is adjusted during assembly such that the residual aberrations are minimized at the position of the optical axis AXa. Accordingly, the Y-direction detection mark portion M1 in FIG. 4 is detected at a point where the residual aberrations are minimal. Therefore, the detection of the Y-direction detection mark portion M1 is practically independent of a position detection error due to the residual aberrations. On the other hand, detection of the X-direction detection mark portions M2a and M2b is carried out at a position away from the optical axis AXa. Accordingly, detection of these marks involves an error due to the residual aberrations. However, the two mark portions M2a and M2b are disposed symmetrically with respect to the optical axis AXa, and hence the adverse effects of the residual aberrations on the detection of the two mark portions M2a and M2b are approximately symmetric. Therefore, the influence of the residual aberrations can be substantially canceled by averaging the detected values for the positions of the two mark portions M2a and M2b. Thus, it is possible according to this embodiment to realize a position detecting system having almost no detection error due to the residual aberrations. The same is true in the case of using a mark obtained by rotating the mark MP shown in FIG. 3 through 90 degrees.

Figure 5:
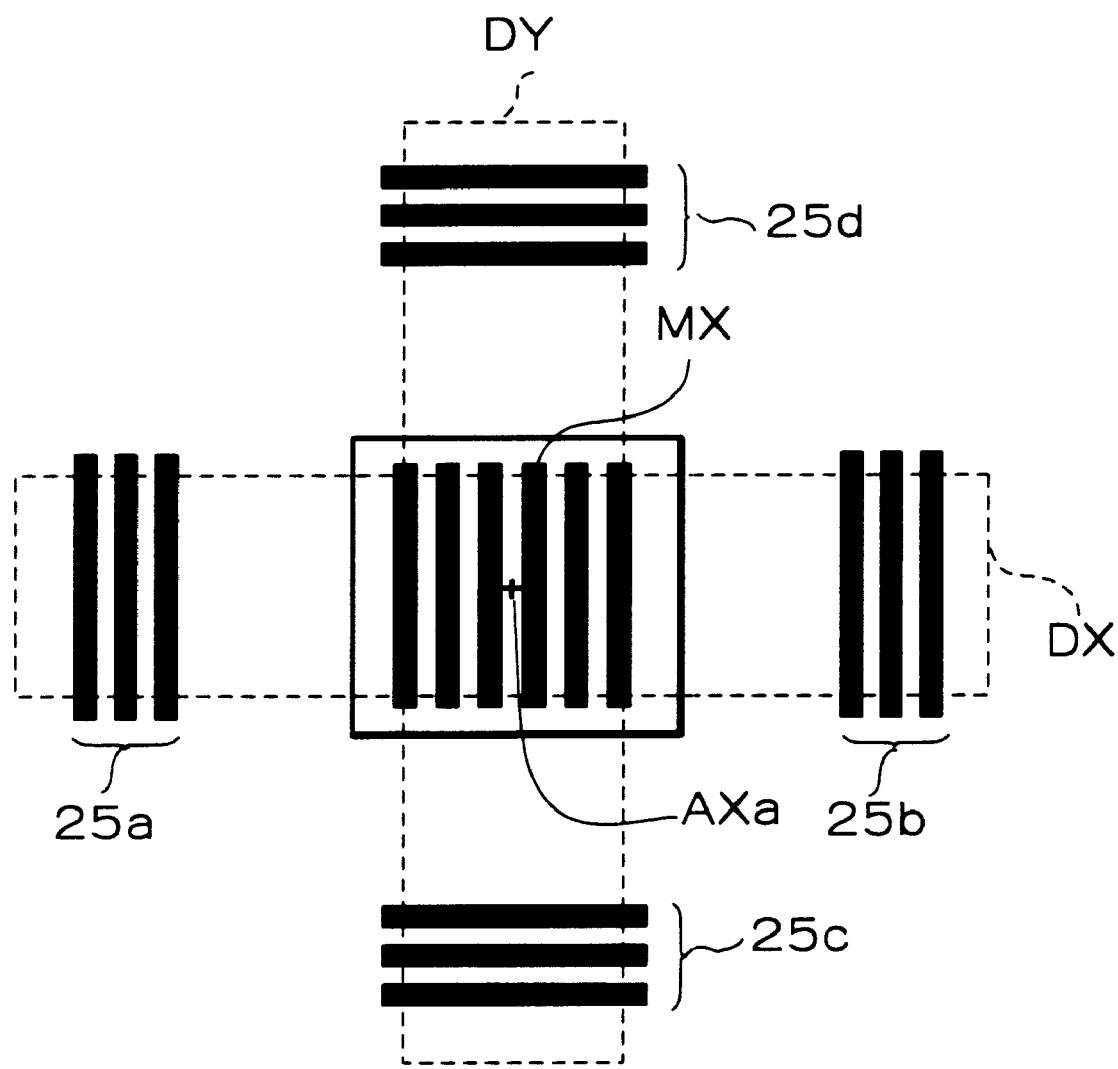
FIG. 5 is a schematic illustration for explaining a method of detecting a conventional mark for one-dimensional position detection by the projection exposure system according to one embodiment of the present invention.

Next, a method of detecting the position of a conventional mark for one-dimensional position detection by the same projection exposure system 100 as that used in this embodiment will be described with reference to FIG. 5. In the figure, index marks 25a, 25b, 25c and 25d correspond to the index marks 52a, 52b, 52c and 52d, respectively.

Figure 8A:
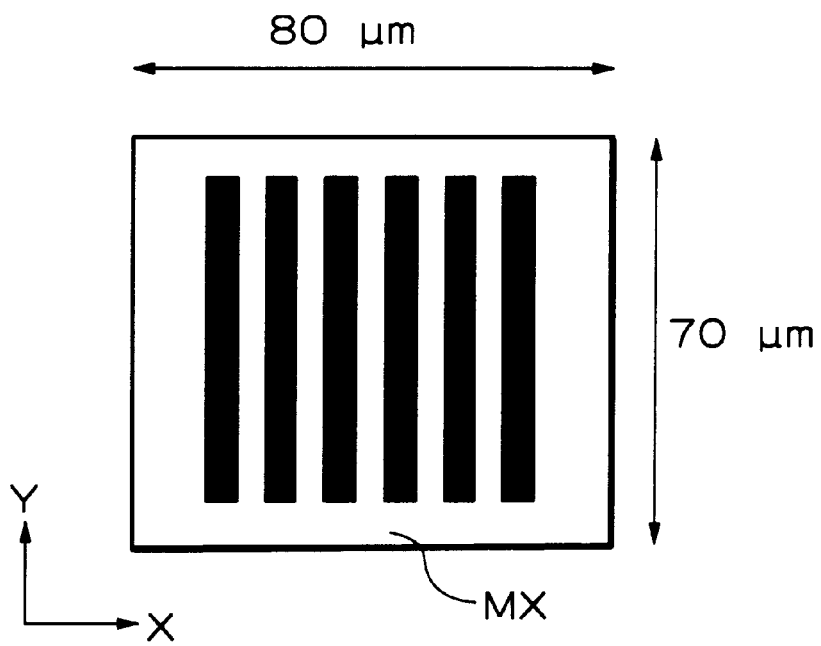
Figure 8B:
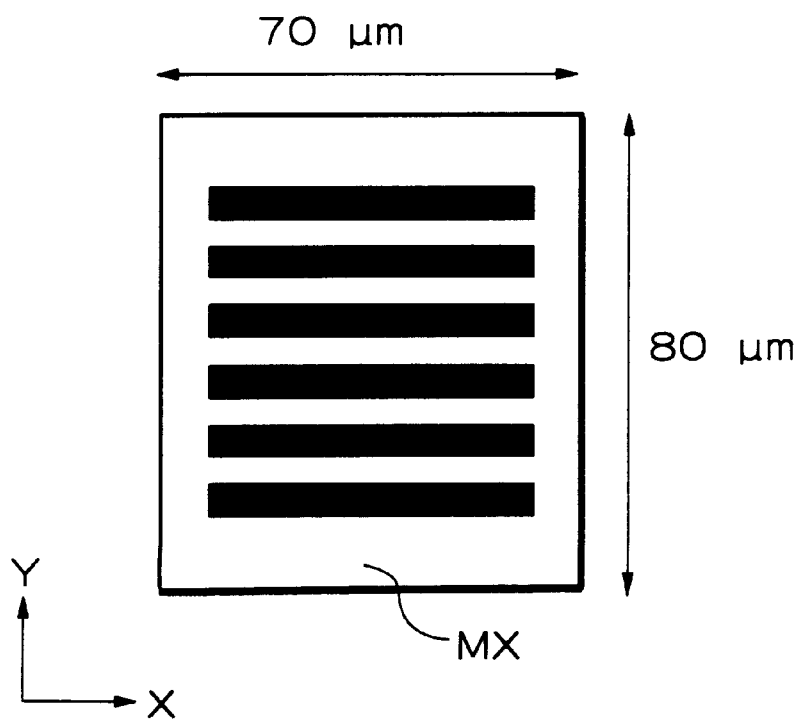
Figure 9:
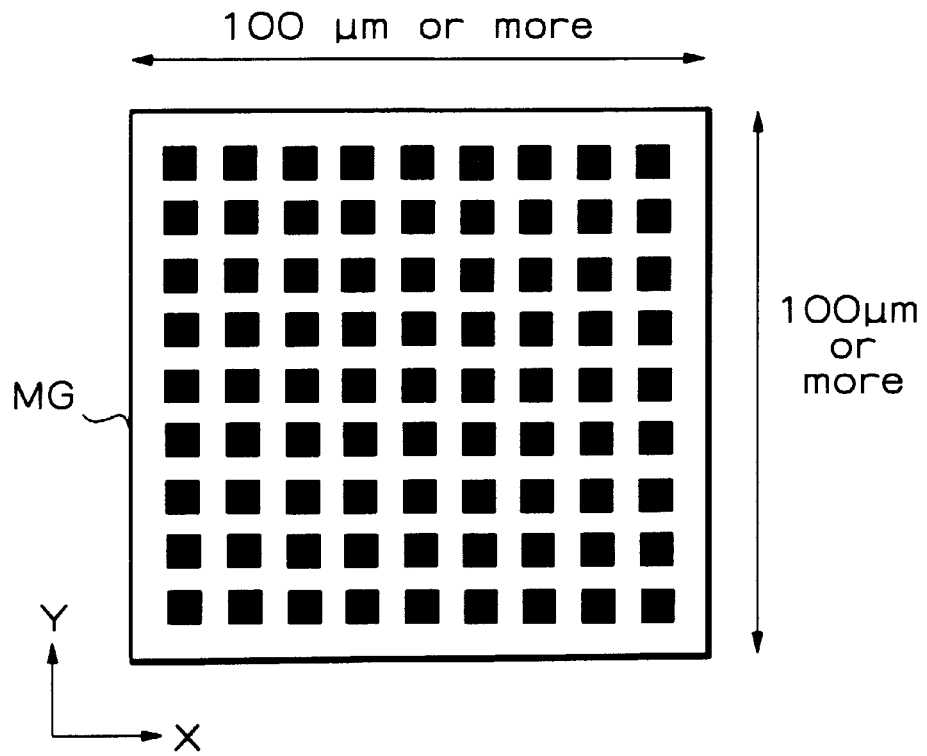
FIG. 9 is a schematic illustration showing one example of conventional two-dimensional marks used for detection in both X and Y directions.

In this case also, the wafer W is roughly aligned so that the center of a conventional mark MX for one-dimensional position detection in the X direction is approximately coincident with the optical axis AXa of the detecting optical system 12. Then, the position in the X-direction of the mark MX for position detection is detected on the basis of the image of the X-direction detecting area DX. Regarding the detection of a mark MY (FIG. 8A) for position detection in the Y direction also, the position of the mark MY is similarly detected on the basis of the image of the Y-direction detecting area DY. In the case of detecting these marks also, position detection of high accuracy can be effected without substantially being influenced by the residual aberrations because the detection can be carried out in areas near the optical axis AXa. Accordingly, it is possible to detect the position of the conventional one-dimensional mark without changing the detecting optical system 12, which is adapted to detect the mark MP for two-dimensional detection.

Figure 6:
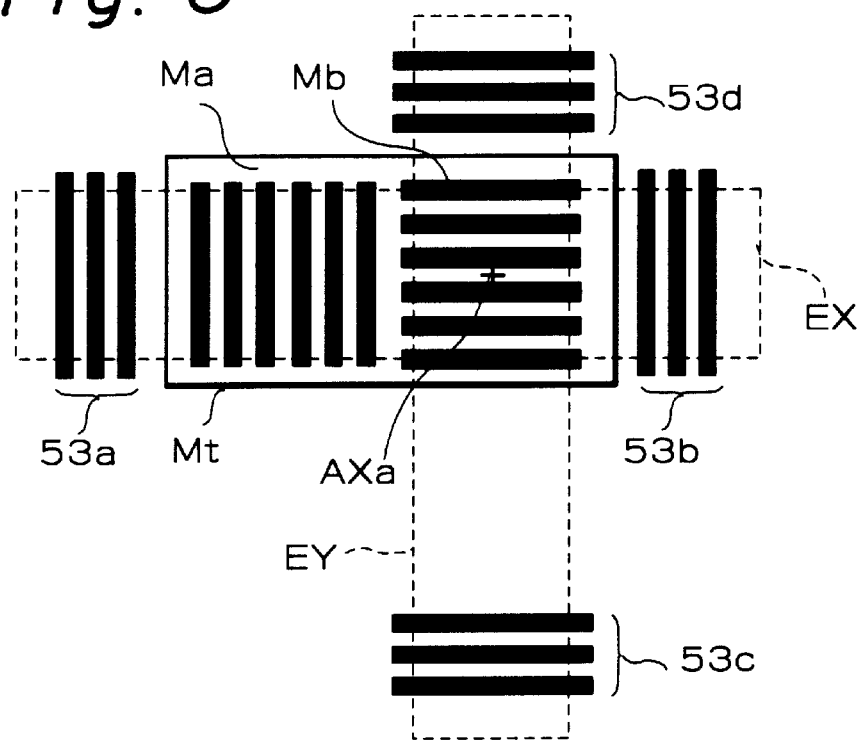
FIG. 6 is a schematic illustration for explaining the position detection of a conventional mark for two-dimensional detection.

To compare the mark MP with a conventional mark for position detection shown in FIG. 10, position detection of the conventional mark Mt for two-dimensional detection will be described below with reference to FIG. 6. To detect the mark Mt in both the X and Y directions simultaneously, four index marks (index marks 53a, 53b, 53c and 53d) are disposed on an index board 53 (not shown; corresponding to the index board 52) as shown in FIG. 6. In detection of the mark Mt, however, if the mark portion Mb for detection in the Y direction is disposed near the optical axis AXa, the mark portion Ma for detection in the X direction is positioned away from the optical axis AXa. Consequently, the detected value for the position of the mark portion Ma is adversely affected by the residual aberrations of the optical system.

Figure 7:
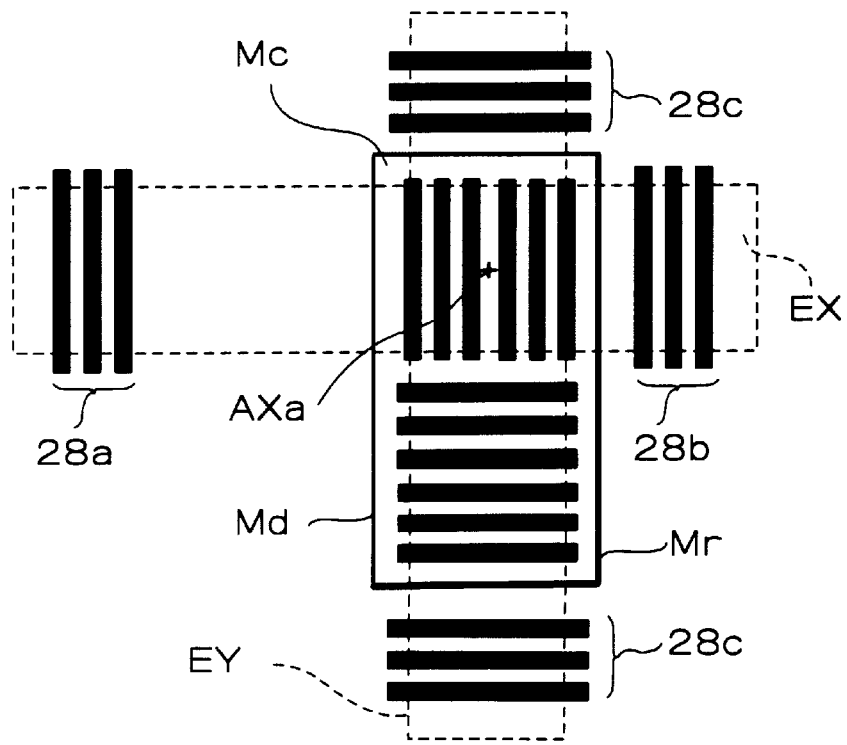
FIG. 7 is a schematic illustration showing the position detection of a mark obtained by rotating the conventional mark for two-dimensional detection in FIG. 6 through 90 degrees.
Figure 10:
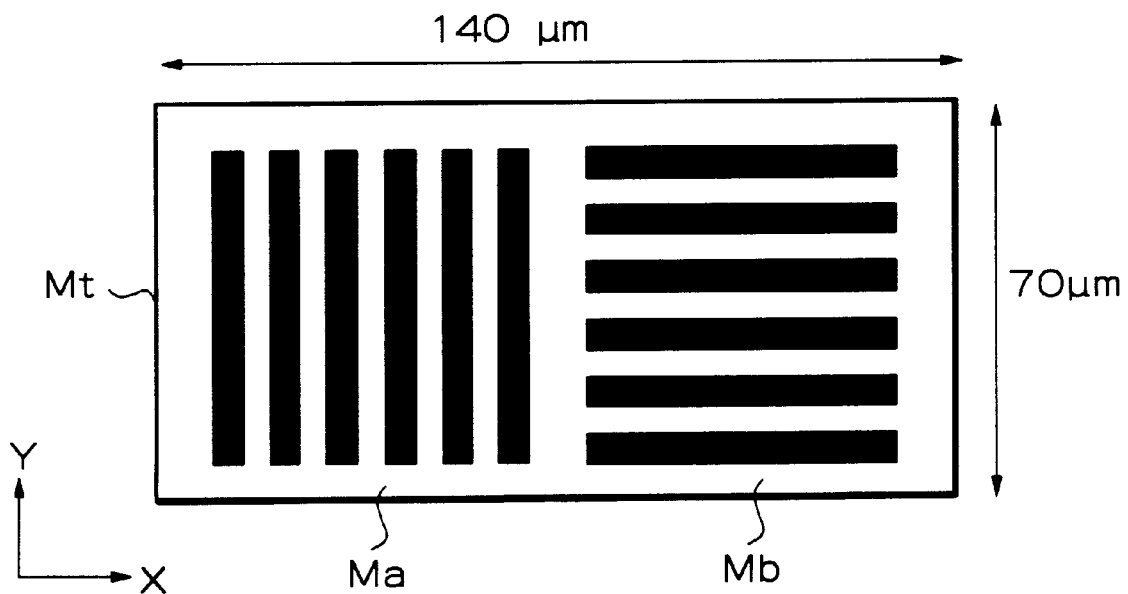
FIG. 10 is a schematic illustration showing another example of the conventional two-dimensional marks.

In a case where a mark Mr obtained by rotating the mark Mt in FIG. 10 through 90 degrees is used in accordance with the orientation of a street line, as shown in FIG. 7, if the mark portion Mc for detection in the X direction is disposed near the optical axis AXa, the mark portion Md for detection in the Y direction is positioned away from the optical axis AXa. Accordingly, the detected value for the position of the mark portion Md is adversely affected by the residual aberrations as in the case of the mark portion Ma. It should be noted that index marks 28*a* through 28*d* in FIG. 7 correspond to the index marks 52*a* through 52*d*, respectively.

In contrast, the mark MP according to the present invention enables simultaneous detection in both the X and Y directions with high accuracy without being adversely affected substantially by the residual aberrations of the detecting optical system 12, as stated above.

Although, in the foregoing description, where the residual aberrations of the detecting optical system 12 are minimized is the position of the optical axis of the detecting optical system 12, it should be noted that in a case where the mark detection center position (i.e. the center of the surrounding index marks 52*a*, 52*b*, 52*c* and 52*d*) deviates from the optical axis AXa, it is desirable to adjust the detecting optical system 12 such that the residual aberrations are minimized at the mark detection center position.

Next, the flow of the operation during exposure of the projection exposure system arranged as described above will be briefly described.

After the wafer W has been loaded on the wafer table 18 by a wafer loader (not shown), rough positioning (search alignment) of the wafer W is performed by the search alignment mechanism (not shown). More specifically, the search alignment is effected, for example, on the basis of the outer shape of the wafer W, or by detecting search alignment marks on the wafer W. In this embodiment also, the search alignment is carried out in the same way as in the conventional practice; therefore, a detailed description thereof is omitted.

Prior to overlay exposure, base line measurement is carried out to measure a positional relationship between the detection center (i.e. the center of the surrounding index marks as stated above) of the alignment sensor AS that detects a mark for position detection on the wafer W and the center of the projection optical system PL (in general, the center of the projection optical system PL is coincident with the reticle center as the center of the reticle pattern). More specifically, the base line measurement is carried out as follows:

① The fiducial plate FP provided on the wafer table 18 is moved to a position where an image of a reticle alignment mark (not shown) is projected through the projection optical system PL. The movement of the fiducial plate FP is effected by moving the XY stage 20 through the driving system 22 under the control of the main controller 28. As stated above, the surface of the fiducial plate FP is approximately flush with the surface of the wafer W (in the optical axis direction), and the fiducial plate FP has fiducial marks (not shown) formed on the surface thereof. At this time, a relative position between the reticle alignment mark and a fiducial mark on the fiducial plate FP is detected, for example, by a reticle microscope (not shown) through the projection optical system PL.

The position of the wafer table 18 at this time is measured by the laser interferometer 26 through the moving mirror 24 provided on the wafer table 18, and the result of the measurement is sent to the main controller 28. The main controller 28 adds the result of the measurement by the laser interferometer 26 and the relative position outputted from the reticle microscope and stores the resulting sum as the reticle position in the RAM.

② Next, the main controller 28 drives the wafer table 18 together with the XY stage 20 as one unit through the driving system 22 to move the fiducial plate FP to a position near the detection reference position of the alignment sensor AS.

Then, the system detects a positional relationship between the center (detection center) of the index marks on the index board 52 incorporated in the a alignment sensor AS and a fiducial mark on the fiducial plate FP. The detected value for the positional relationship and the output value of the laser interferometer 26 (i.e. the position of the wafer table 18) at this time are sent to the main controller 28. The main controller 28 adds the detected value and the output value and defines the resulting sum as the alignment sensor position. Moreover, the main controller 28 determines a difference between the reticle position and the alignment sensor position and stores the difference as "measured base line value" in the RAM.

After the above sequence of base line measurement, overlay exposure onto the waver W is initiated. That is, the position of the mark MP for position detection on the wafer W is detected by the alignment sensor AS as described above. In this embodiment, the position of the mark MP can be detected in both the X and Y directions simultaneously. Accordingly, the position measurement can be carried out in a short period of time in comparison to the conventional practice.

The main controller 28 adds the positional relationship between the mark MP for position detection and the center of the index marks in the alignment sensor AS and the position of the wafer table 18 (i.e. the output value from the laser interferometer 26) at this time and recognizes the resulting sum as the mark position.

Subsequently, the main controller 28 moves the wafer W (i.e. the wafer table 18) from this position by a distance corresponding to the sum of the base line quantity and the designed coordinate values of the position detection mark MP, relying on the measured value from the laser interferometer 26.

Thus, the projected image of the pattern on the reticle R and the existing pattern on the wafer W are accurately aligned with each other. In this state, exposure is carried out to project and thereby transfer the pattern on the reticle R onto the wafer W.

In this way, each shot area on the wafer W is successively moved to the position where the image of the reticle pattern is projected, and exposure (projection transfer) is repeated. Thus, step-and-repeat exposure is performed.

As has been described above, the mark MP for position detection according to the present invention makes it possible to detect the position of the mark MP in both the X and Y directions simultaneously and also enables the length of each short side of the mark MP to be reduced to a value not greater than the width of an ordinary street line. Therefore, a mark for simultaneous position detection in two directions can be disposed without a need of providing a new area for a mark for position detection on the wafer W. Moreover, because the time required for mark position detection can be shortened, it becomes possible to improve the throughput of the projection exposure system 100.

In addition, the mark MP has mark portions for detection in the X- and Y-axis directions, respectively. For one of the two directions, the position of a mark portion of the mark P is detected at the minimal aberration point of the alignment sensor AS. For the other direction, the positions of two mark portions of the mark MP are detected at respective points symmetric with respect to the minimal aberration point, and the detected values for the positions of the two mark portions are averaged. Therefore, highly accurate position detection can be effected without being adversely affected substantially by the residual aberrations of the detecting optical system. Accordingly, it is possible to improve the accuracy of alignment (registration) of a projected image of the pattern on the reticle R and an existing pattern on the wafer W during the exposure, which is performed by using the result of the position detection of the mark MP.

Although in the foregoing embodiment the position detection of the mark MP is carried out by using the index marks 52a, 52b, 52c and 52d formed on the index board 52 as position references, it should be noted that the positions of the pixels of the image pickup device 14 (e.g. the image pickup pixels of a CCD) may be used as references for detection without using index marks such as those described above. In such a case, it is possible to omit the index illuminating system 56 through 62 in the detecting optical system 12 shown in FIG. 2.

The above-described step-and-repeat exposure operation may be carried out by an EGA (Enhanced Global Alignment) method in which, prior to exposure, marks for position detection in a plurality of shot areas are detected, and the detected values are statistically processed to determine an array of exposure shot areas, and then exposure is carried out for all shot areas on the basis of the exposure shot array. Alternatively, the exposure operation may be carried out by a die-by-die method in which a mark for position detection provided in each shot area on a wafer W is detected for each shot area to carry out overlay exposure for the shot area.

Although in the foregoing embodiment the mark for position detection and mark detecting apparatus according to the present invention are applied to a step-and-repeat projection exposure system, the mark for position detection and mark detecting apparatus according to the present invention are not necessarily limited thereto, but may also suitably be applied to step-and-scan projection exposure systems and other exposure systems.

As partially touched on before, in exposure apparatuses to which the present invention can be applied, which are of the step and repeat type, step and scan type, the mirror projection type and the like, illumination light for exposure can be selected from bright lines (e.g., g and i lines) of a mercury lamp, excimer laser (e.g., KrF excimer laser of 248 nm, ArF excimer laser of 193 nm and $F_2$ excimer laser of 157 nm), and higher harmonics of YAG laser (or metal vapor laser) and the like. EUV (Extreme Ultra Violet) light of the wavelength range of 5–15 nanometers may also be used. The present invention can also be applied to X-ray exposure apparatuses and electronic ray exposure apparatuses.

Furthermore, in a photolithography process for producing microdevices, such as semiconductor devices, images of patterns formed on ten-odd reticles, respectively, are successively transferred onto a semiconductor wafer in a overlaying manner. The images of the patterns are formed on a plurality of layers laid on the wafer, respectively. More specifically, an image of a first pattern of a first reticle is formed on a first layer on the wafer and then an image of a second pattern of a second reticle is formed on a second layer which has been laid on the first layer so that the images of the first and second patterns are in a predetermined alignment. In order to carry out an accurate alignment between the transferred first and second patterns, an alignment mark which has been formed on the first layer when the first pattern image is formed is detected to determine its position and then the second reticle and the wafer are moved relative to each other based on the thus determined position of the alignment mark. By this operation, the second pattern is transferred onto the second layer which is a photoresist layer on the first layer while the transferred second patterns being aligned with the transferred first pattern. As appreciated from the foregoing, the first reticle has an alignment mark as well as the first pattern for carrying out alignment between the semiconductor wafer and the second reticle and hence between the transferred first pattern on the first layer and the second pattern. It will be understood from the foregoing that an alignment mark of the present invention (FIG. 3) is formed not only on a substrate such as semiconductor wafer and glass plate on which microdevices (such as semiconductor devices, liquid-crystal display devices, image pickup devices (CCDs) and thin-film magnetic heads) are formed, but also on a reticle on which a device pattern is depicted. In short, an alignment mark according to this invention can be applied to both of a substrate coated with photoresist and a reticle (mask) having a device pattern to be transferred to the substrate.

As has been described above, the present invention makes it possible to provide a novel, excellent mark for position detection that allows the time required for mark detection to be shortened and enables highly accurate position detection substantially independent of the residual aberrations of a detecting optical system.

What is claimed is:

1. An object having a mark for position detection that indicates the position of said object with relation to first and second axes perpendicular to each other, said mark comprising:

a first pattern having a plurality of bar-like patterns each of which extends with longer continuity in said second axis direction than in said first axis direction, wherein said plurality of bar-like patterns are formed with periodicity in said first axis direction; and second patterns respectively disposed near both sides of said first pattern in said second axis direction, said second patterns having a plurality of bar-like patterns each of which extends with longer continuity in said first axis direction than in said second axis direction, wherein said plurality of bar-like patterns are formed with periodicity in said second axis direction.

2. A mark for position detection according to claim 1, wherein a period of each of said first and second patterns is in a range of from about 6 micrometers to about 16 micrometers.

3. A mark for position detection according to claim 1, wherein a length of each short side of a mark region in which said first and second patterns are formed is in a range of from about 50 micrometers to about 70 micrometers.

4. An object according to claim 1, wherein said first pattern is disposed near a center in said second axis direction of said mark for position detection.

5. An object according to claim 4, wherein said first pattern is disposed near a center of said mark for position detection.

6. An object according to claim 5, wherein said second patterns are disposed in a symmetric relation to each other with respect to a center of said mark for position detection.

7. An objection according to claim 4, wherein said second patterns are disposed in a symmetric relation to each other with respect to a center in said second axis direction of said mark for position detection.

8. An object according to claim 1, wherein said object comprises a substrate.

9. An object according to claim 1, wherein said object comprises a mask.

10. An object according to claim 1, wherein said first pattern is utilized to detect a position in said first axis direction of said object, and said second patterns are utilized to detect a position in said second axis direction of said object.

11. An object according to claim 1, wherein said first pattern has periodicity only in said first axis direction, and said second patterns have periodicity only in said second axis direction.

12. A mark detecting method for determination of a position of a mark for position detection formed on an object with relation to first and second axes perpendicular to each other, said method comprising the steps of:

preparing a mark detection apparatus having a detection center;

disposing a central mark region of said mark near said detection center; and detecting a position in said fist axis direction of said mark by using said central mark region, and detecting a position in said second axis direction of said mark by using mark regions which are placed adjacent to both sides of said central mark region in said second axis direction.

13. A mark detecting method according to claim 12, wherein said central mark region is aligned with said detection center.

14. A mark detecting method according to claim 12, wherein said mark regions adjacent to both sides of said central mark region are positioned symmetrically with respect to said detection center.

15. An object according to claim 12, wherein said object comprises a substrate.

16. An object according to claim 12, wherein said object comprises a mask.

17. A mark detecting method according to claim 12, wherein in said central mark region, there is provided with a first pattern comprising a plurality of bar-like patterns each of which extend with longer continuity in said second axis direction than in said first axis direction, wherein said plurality of bar-like patterns are formed with periodicity in said first axis direction;

in both sides of said central mark region, there are provided with second patterns comprising a plurality of bar-like patterns each of which extends with longer continuity in said first axis direction than in said second axis direction, wherein said plurality of bar-like patterns are formed with periodicity in said axis direction.

18. A mark detecting method according to claim 17, wherein said first pattern has periodicity only in said first axis direction, and said second patterns have periodicity only in said second axis direction.

19. A mark detecting apparatus for determination of a position of a mark for position detection formed on an object with relation to first and second axes perpendicular to each other, said mark having:

a first pattern comprising a plurality of bar-like patterns having periodicity each of which extends with longer continuity in said second axis direction than in said first axis direction; and second patterns respectively disposed near both sides of said first pattern in said second axis direction, said second patterns comprising a plurality of bar-like patterns each of which extends with longer continuity in said first axis direction than in said second axis direction, wherein said plurality of bar-like patterns are formed with periodicity, said apparatus further comprising:

a processor that photoelectrically detects said mark, and then obtains a position of said mark in said first and second axis directions by processing a detection signal of said mark.

20. A mark detecting apparatus according to claim 19, wherein said processor obtains a position of said mark in said second axis direction by averaging data obtained from said second patterns.

21. A mark detecting apparatus according to claim 19, said apparatus further comprising:

a substrate stage on which said substrate is placed, said substrate stage being movable in a reference plane, together with said substrate placed thereon; and said processor for detecting photoelectrically said mark when said substrate stage is in a stationary state.

22. A mark detecting apparatus according to claim 19, wherein said processor detects photoelectrically said first pattern and second patterns in parallel.

23. A mark detecting apparatus according to claim 19, wherein said processor processes only a detection signal obtained from said second pattern in obtaining a position of said mark in said second axis direction.

24. A mark detecting apparatus according to claim 23, wherein said processor sets up a slice level, with which a position of said mark is obtained in said second axis direction, higher than a predetermined value.

25. A mark detecting apparatus according to claim 24, wherein said predetermined value is the level of a detection signal above which said first pattern is detected in detecting said second axis direction.

26. A mark detecting apparatus according to claim 19 said mark detecting apparatus further comprising:

image pickup devices located in said processor; and an optical system for projecting two dimensional images of the first and second patterns onto said image pickup devices, wherein said processor obtains the position of said mark based on two dimensional images projected onto said image pickup devices.

27. A mark detecting apparatus according to claim 26, wherein said processor obtains the position of said mark by using the positions of the pixels of the image pickup device as references for detection.

28. A mark detecting apparatus according to claim 26, said mark detecting apparatus further comprising:

an index board on which a pair of first index marks are formed along said first axis direction and a pair of second index marks are formed along said second axis direction;

wherein said pair of first index marks and said par of second index marks are positioned so as to surround an optical axis of said optical system, respectively.

29. A mark detecting apparatus according to claim 28, wherein said optical system projects two dimensional images of said first and second index marks onto said image pickup devices, said two dimensional images of said first index marks are positioned on said image pickup devices so as to surround the two dimensional image of said first pattern, and said two dimensional images of said second index marks are positioned on said image pickup devices so as to surround the two dimensional image of said first and second patterns.

30. A mark detecting apparatus according to claim 19, wherein said first pattern is disposed near a center of said mark for position detection.

31. A mark detection apparatus according to claim 30, said second patterns are disposed in a symmetric relation to each other with respect to a center of said mark for position detection.

32. A mark detecting apparatus according to claim 19, wherein said object comprises a substrate.

33. A mark detecting apparatus according to claim 19, wherein said object comprises a mask.

34. A mark detecting apparatus according to claim 19, wherein said first pattern has periodicity only in said first axis direction, and said second patterns have periodicity only in said second axis direction.

* * * * *